United States Patent (10) Patent No.: US 6,420,774 B1
Lin et al. (45) Date of Patent: Jul. 16, 2002

(54) LOW JUNCTION CAPACITANCE SEMICONDUCTOR STRUCTURE AND I/O BUFFER

(75) Inventors: Geeng-Lih Lin; Ming-Dou Ker, both of Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/413,407

(22) Filed: Oct. 6, 1999

(30) Foreign Application Priority Data

May 5, 1999 (TW) ........................ 88107281 A

(51) Int. Cl.$^7$ ................ H01L 31/119; H01L 29/00; H01L 31/111; H01L 23/62
(52) U.S. Cl. .............. 257/545; 257/406; 257/386; 257/336; 257/376; 257/335; 257/344; 257/548; 257/408; 257/156; 257/549; 257/360
(58) Field of Search .................. 257/545, 406, 257/386, 336, 376, 335, 344, 548, 408, 156, 549, 360, 900

(56) References Cited

U.S. PATENT DOCUMENTS 5,008,723 A * 4/1991 Van der Have ............ 357/23.7
5,759,901 A * 6/1998 Loh et al. .................. 438/305
5,777,368 A * 7/1998 Wu et al. ................... 257/360
6,051,860 A * 4/2000 Odanaka et al. ........... 257/316
6,150,699 A * 11/2000 Wakabayashi .............. 257/378

* cited by examiner

Primary Examiner—Stephen D. Meier
Assistant Examiner—James Mitchell
(74) Attorney, Agent, or Firm—Intellectual Property Solutions, PLLC

(57) ABSTRACT

A low junction capacitance semiconductor structure and an I/O buffer are disclosed. The semiconductor structure includes a MOS transistor and a lightly doped region. The MOS transistor is formed in a semiconductor substrate and has a gate and source and drain region formed aside the gate. The lightly doped region has a conductivity the same as the source and drain regions, and is formed in the drain region and has a depth larger than the source and drain regions. Further, the lightly doped region can be achieved by CMOS-compatible processes, and the formed devices in the well can be isolated from the semiconductor substrate using deeply doped regions which are usually adopted in advanced technologies.

8 Claims, 5 Drawing Sheets

LOW JUNCTION CAPACITANCE SEMICONDUCTOR STRUCTURE AND I/O BUFFER

BACKGROUND OF THE INVENTION

DESCRIPTION OF THE INVENTION

The present invention relates to a semiconductor device, and in particular, to a low junction capacitance semiconductor structure and an I/O buffer, in which the junction capacitance of the semiconductor structure and the input capacitance of the I/O buffer can be both reduced.

In advanced technologies, speed performance and driving capacity are both important specifications for chip designs. However, a large driving capacity usually means a large device width which consumes a large junction capacitance. Especially for ESD circuits, most designers keep a large spacing between contacts and poly gates, thus increasing the junction capacitance with the increasing of the device width. Further, the increasing junction capacitance will also impact the hi-speed performance and reduce the design window.

FIG. 1 (Prior Art) is a sectional diagram showing a conventional complementary I/O buffer I1 which is formed on a semiconductor substrate, such as a P-type silicon substrate 10. In FIG. 1, the complementary I/O buffer I1 includes an NMOS transistor N1 and a PMOS transistor P1. The NMOS transistor N1 is formed in the P-type silicon substrate 10. The PMOS transistor P1 is formed in an N-well 20 which is formed on the P-type silicon substrate 10. The NMOS transistor N1 has a gate 12 and N-type source and drain regions 14, 16 formed aside the gate 12. The PMOS transistor P1 has a gate 22 and P-type source and drain regions 24, 26 formed aside the gate 22. The drain region 16 of the NMOS transistor N1 and the drain region 26 of the PMOS transistor P1 are connected through contact windows 31 to a pad 30. The pad 30 is then connected as an I/O terminal of the complementary I/O buffer I1.

FIG. 2 (Prior Art) is an equivalent circuit diagram of the complementary I/O buffer I1 in FIG. 1. As shown in FIG. 2, when a low voltage is input to the gate 22 of the PMOS transistor P1, a positive voltage from the positive voltage source VD will be transferred to internal circuits though the PMOS transistor P1, the pad 30 and a resistor R connecting to the internal circuits. On the contrary, when a high voltage is input to the gate 12 of the NMOS transistor N1, a negative voltage from the negative voltage source $V_{ss}$ will be transferred to the internal circuits though the NMOS transistor N1, the pad 30 and the resistor R.

For this case, to prevent leakage currents due to the shortening of the poly gates in advanced technologies, the concentration for anti-punch through implant is usually increased, thus increasing the junction capacitance. In other circuits, such as ESD circuits, to improve driving capacity and ESD endurance, size and layout area for MOS transistors are also increased, thus increasing the junction capacitance of the MOS transistors (Cjp for the PMOS transistor P1 and Cjn for the NMOS transistor N1). Therefore, the parasitic junction capacitance connecting to the pad 30 may reach as high as 5 pF, which will severely impact the hi-speed performance of input signals. As a consequence, it is necessary to limit the parasitic junction capacitance connecting to the pad in advanced IC designs. For example, in RAMBUS DRAM specifications, the parasitic junction capacitance connecting to the pad is limited to less than 2.4 pF so that the hi-speed requirements can be satisfied.

SUMMARY OF THE INVENTION

Therefore, it is an object of the present invention to provide a low junction capacitance semiconductor structure and an I/O buffer, in which the junction capacitance of the semiconductor structure and the input capacitance of the I/O buffer are both reduced, thus improving its hi-speed performance.

It is another object of the present invention to provide a low junction capacitance semiconductor structure and an I/O buffer, in which the occupied chip area is greatly reduced without losing any driving capacity and ESD endurance.

To achieve above and other objects, the present invention provides a low junction capacitance semiconductor structure. This semiconductor structure includes a MOS transistor and a lightly doped region. The MOS transistor is formed on a semiconductor substrate, and has a gate and source and drain regions formed aside the gate. The lightly doped region has a conductivity the same as the source/drain regions, and is formed immediately below the drain region of the MOS transistor.

In this semiconductor structure, the semiconductor substrate can be a P-type silicon substrate, and the source and drain regions and the lightly doped region can be N-type.

Or, in this semiconductor structure, the semiconductor substrate can be an N-type silicon substrate, and the source and drain regions and the lightly doped region can be P-type.

Further, the present invention also provides a low junction capacitance semiconductor structure. This semiconductor structure includes a MOS transistor, a lightly doped region and a deeply doped region. The MOS transistor is formed in a well, and has a gate and source and drain regions formed aside the gate. The lightly doped region has a conductivity the same as the source and drain regions, and is formed immediately below the drain region of the MOS transistor and has a depth equal to the well. The deeply doped region having a conductivity the same as the well is then formed at the bottom of the lightly doped region to isolate the lightly doped region and the semiconductor substrate.

In this semiconductor structure, the well and the deeply doped region, are N-type, and the source and drain regions and the lightly doped region are P-type. Or, in this semiconductor structure, the well and the deeply doped region are P-type, and the source and drain regions and the lightly doped region are N-type.

Further, the present invention also provides a low junction capacitance I/O buffer. This I/O buffer includes a semiconductor substrate, a well, a first transistor, a second transistor, a first lightly doped region, a second lightly doped region and an I/O terminal. The well is formed at a predetermined location on the semiconductor substrate. The first transistor is formed on the semiconductor substrate, and has a first gate and first source and drain regions aside the first gate. The second transistor is formed on the well, and has a second gate and second source and drain regions aside the second gate. The first lightly doped region is formed immediately below the first drain regions, and has a conductivity the same as the first source and drain regions of the first transistor. The second lightly doped region is formed immediately below the second drain region, and has a conductivity the same as the second source and drain regions and has a depth equal to the well. The I/O terminal is then connected between the first drain region of the first transistor and the second drain region of the second transistor.

In this I/O buffer, a deeply doped region can be further formed at the bottom of the second lightly doped region in the well to isolate the lightly doped region and the semiconductor substrate.

BRIEF DESCRIPTION OF THE DRAWINGS

The aforementioned objects, features and advantages of this invention will become apparent by referring to the following detailed description of a preferred embodiment with reference to the accompanying drawings, wherein.

DETAILED DESCRIPTION OF THE EMBODIMENT

In a MOS transistor, because the junction capacitance between the source and drain regions and the semiconductor substrate is related to a concentration difference between the source and drain regions and the semiconductor substrate, the present invention introduces a lightly doped region in the drain region of the MOS transistor, which has a conductivity the same as the source and drain regions and has a depth larger than the source and drain regions. Thus, the concentration difference between the lightly doped region and the semiconductor substrate can be reduced, and the junction capacitance of the MOS transistor can be also reduced.

Thereafter, two examples involving two low junction capacitance semiconductor structures which are respectively formed on a semiconductor substrate are illustrated.

Figure 1:
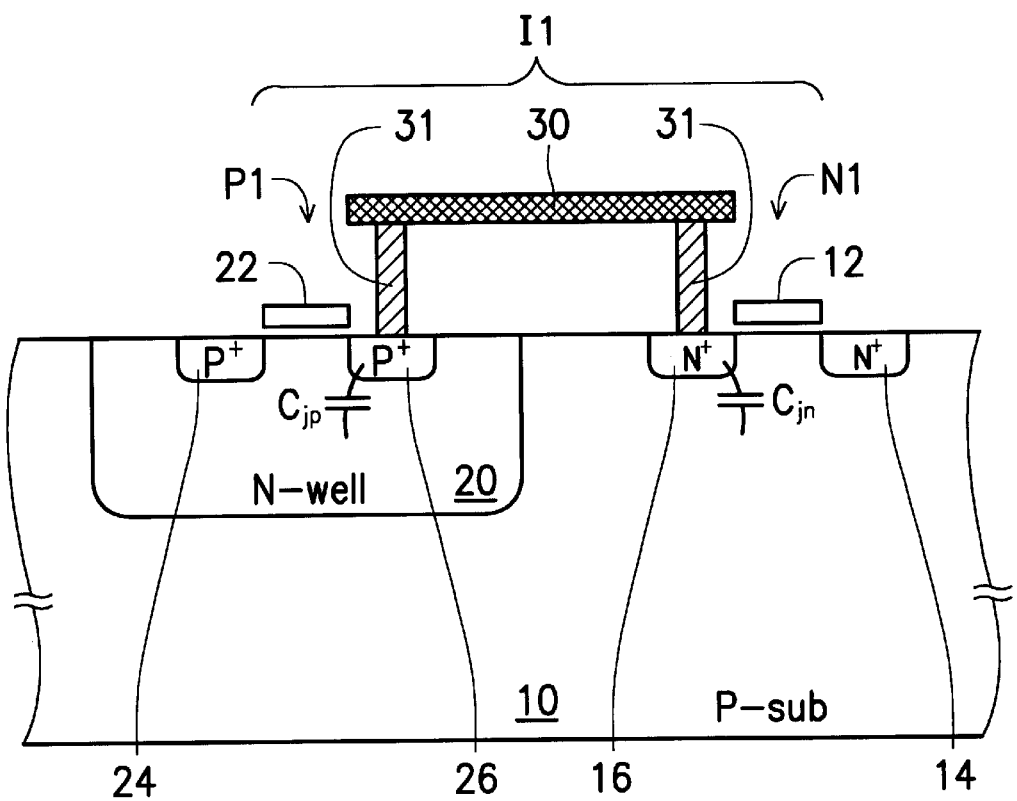
FIG. 1 (Prior Art) is a sectional diagram showing a conventional complementary I/O buffer which is formed on a semiconductor substrate.
Figure 2:
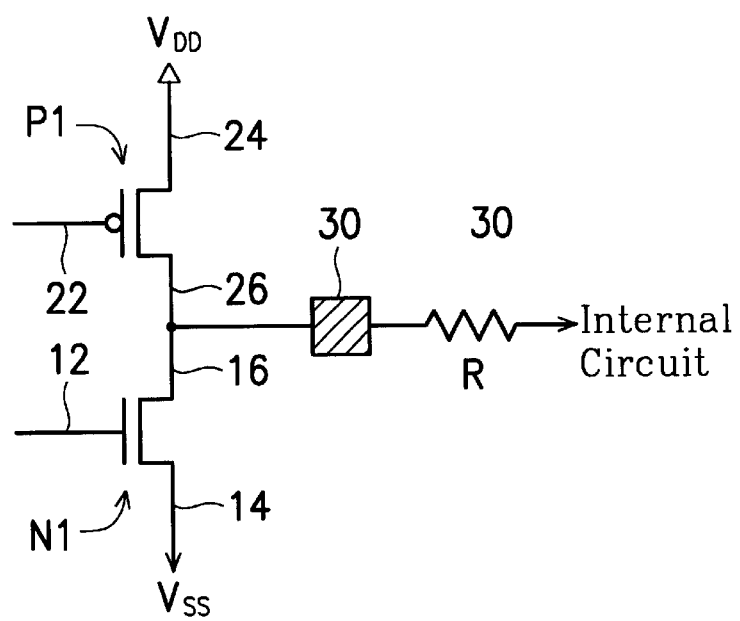
FIG. 2 (Prior Art) is an equivalent circuit diagram of the complementary I/O buffer in FIG. 1.
Figure 3A:
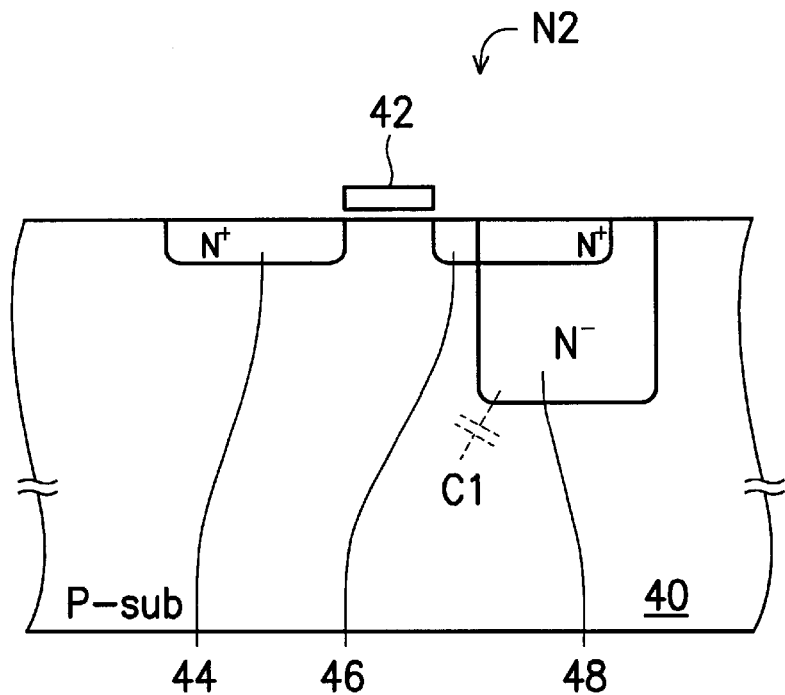
FIG. 3A is a sectional diagram showing a low junction capacitance semiconductor structure which is formed on a P-type silicon substrate according to the present invention.

FIG. 3A is a sectional diagram showing a low junction capacitance semiconductor structure which is formed on a P-type silicon substrate. In FIG. 3A, the semiconductor structure includes an NMOS transistor N2 formed on a semiconductor substrate, say a P-type silicon substrate 40. The NMOS transistor N2 has a gate 42 and source and drain regions 44, 46 formed aside the gate 42. An N-type lightly doped region 48 is then formed immediately adjacent to and below the drain region 46 of the NMOS transistor N2 in order to reduce the junction capacitance between the drain region 46 and the P-type silicon substrate 40, which is shown as C1 in FIG. 3A.

Figure 3B:
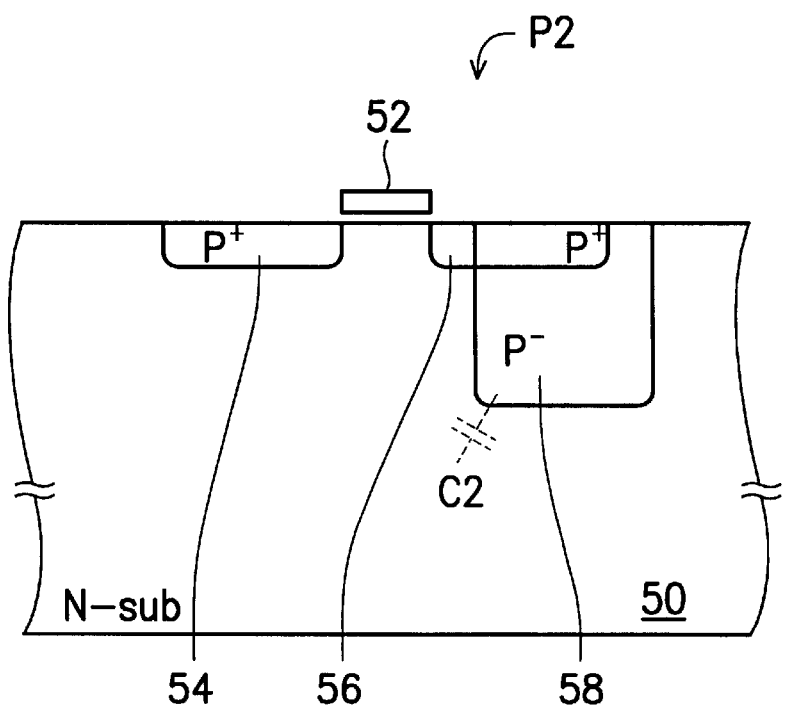
FIG. 3B is a sectional diagram showing another low junction capacitance semiconductor structure which is formed on an N-type silicon substrate according to the present invention.

FIG. 3B is a sectional diagram showing another low junction capacitance semiconductor structure which is formed on an N-type silicon substrate. In FIG. 3B, the semiconductor structure includes a PMOS transistor P2 formed on a semiconductor substrate, say an N-type silicon substrate 50. The PMOS transistor P2 has a gate 52 and source and drain region 54, 56 formed aside the gate 52. A P-type lightly doped region 58 is then formed immediately adjacent to and below the drain region 56 of the PMOS transistor P2 in order to reduce the junction capacitance between the drain region 56 and the N-type silicon substrate 50, which is shown as C2 in FIG. 3B.

However, most circuits are combined with CMOS transistors (both NMOS and PMOS transistors), so wells with different conductivity will be formed in the semiconductor substrate to provide both NMOS transistors and PMOS transistors. Further, because the wells is not as deep as the semiconductor substrate, when the lightly doped region is formed immediately below the source and drain regions in the well, another deeply doped region which has a conductivity opposite to the lightly doped region can be further provided at the bottom of the lightly doped region to prevent the lightly doped region from penetrating the wells and directly connecting to the semiconductor substrate below the wells.

Thereafter, two examples involving two semiconductor structures which are respectively formed on a well are illustrated.

Figure 4A:
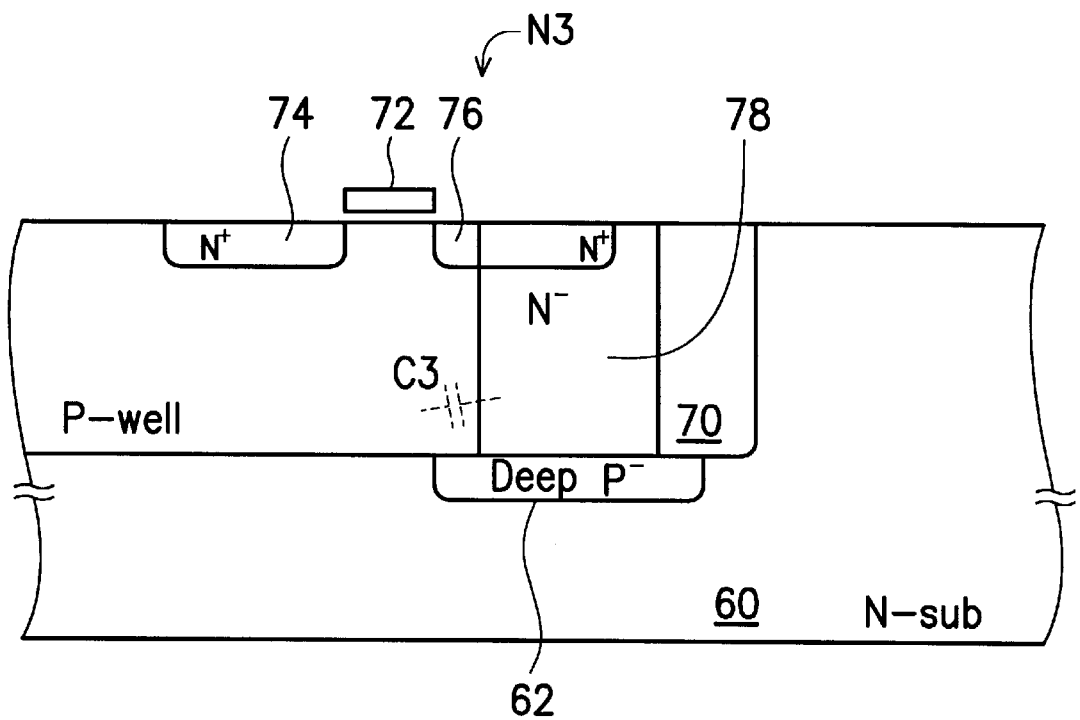
FIG. 4A is a sectional diagram showing another low junction capacitance semiconductor structure which is formed on a P-well according to the present invention.

FIG. 4A is a sectional diagram showing another low junction capacitance semiconductor structure which is formed on a P-type well. The FIG. 4A, a P-type well 70 is formed on a semiconductor substrate, say an N-type silicon substrate 60. The semiconductor structure includes an NMOS transistor N3 is formed on P-type well 70. The NMOS transistor N3 has a gate 72 and N-type lightly doped region 78 is then formed in the P-type well 70 and immediately adjacent to and below the drain region 76 of the NMOS transistor N3 to reduce the junction capacitance between the drain region 76 and the P-type well 70, which is shown as C3 in FIG. 4A. In FIG. 4, because the P-type well 70 is not as deep as the N-type silicon substrate 60, another P-type deeply doped region 62 is further formed at the bottom of the lightly doped region 78 to prevent the lightly doped region 78 from penetrating the P-type well 70 and directly contacting the N-type silicon substrate 60 below the P-type well 70.

Figure 4B:
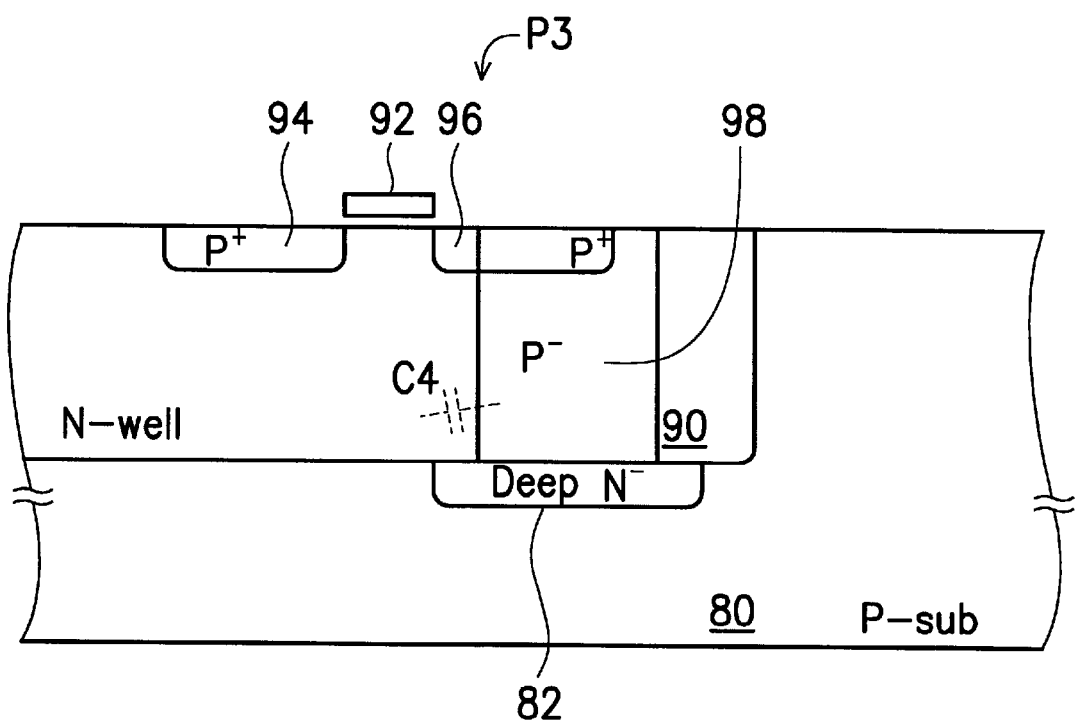
FIG. 4B is a sectional diagram showing another low junction capacitance semiconductor structure which is formed on an N-well according to the present invention.

FIG. 4B is a sectional diagram showing another low junction capacitance semiconductor structure which is formed on an N-type well. In FIG. 4B, an N-type well 90 is formed on a semiconductor substrate, say a P-type silicon substrate 80. The semiconductor structure includes a PMOS transistor P3 formed on the N-type well 90. The PMOS transistor P3 has a gate 92 and P-type source and drain regions 94, 96 formed aside the gate 92. Another P-type lightly doped region 98 is then formed in the N-type well 90 and immediately adjacent to the drain region 96 of the PMOS transistor P3 to reduce the junction capacitance between the drain region 96 and the N-type well 90, which is shown as C4 in FIG. 4B. In FIG. 4B, because the N-type well 90 is not as deep as the P-type silicon substrate 80, another N-type deeply doped region 82 is further formed at the bottom of the lightly doped region 98. thus, the lightly doped region 98 will not penetrate then-type well 90 and directly contact the P-type silicon substrate 80 below the N-type well 90.

Thereafter, two example involving two low junction capacitance I/O buffers which are respectively formed on a semiconductor substrate are illustrated.

Figure 5:
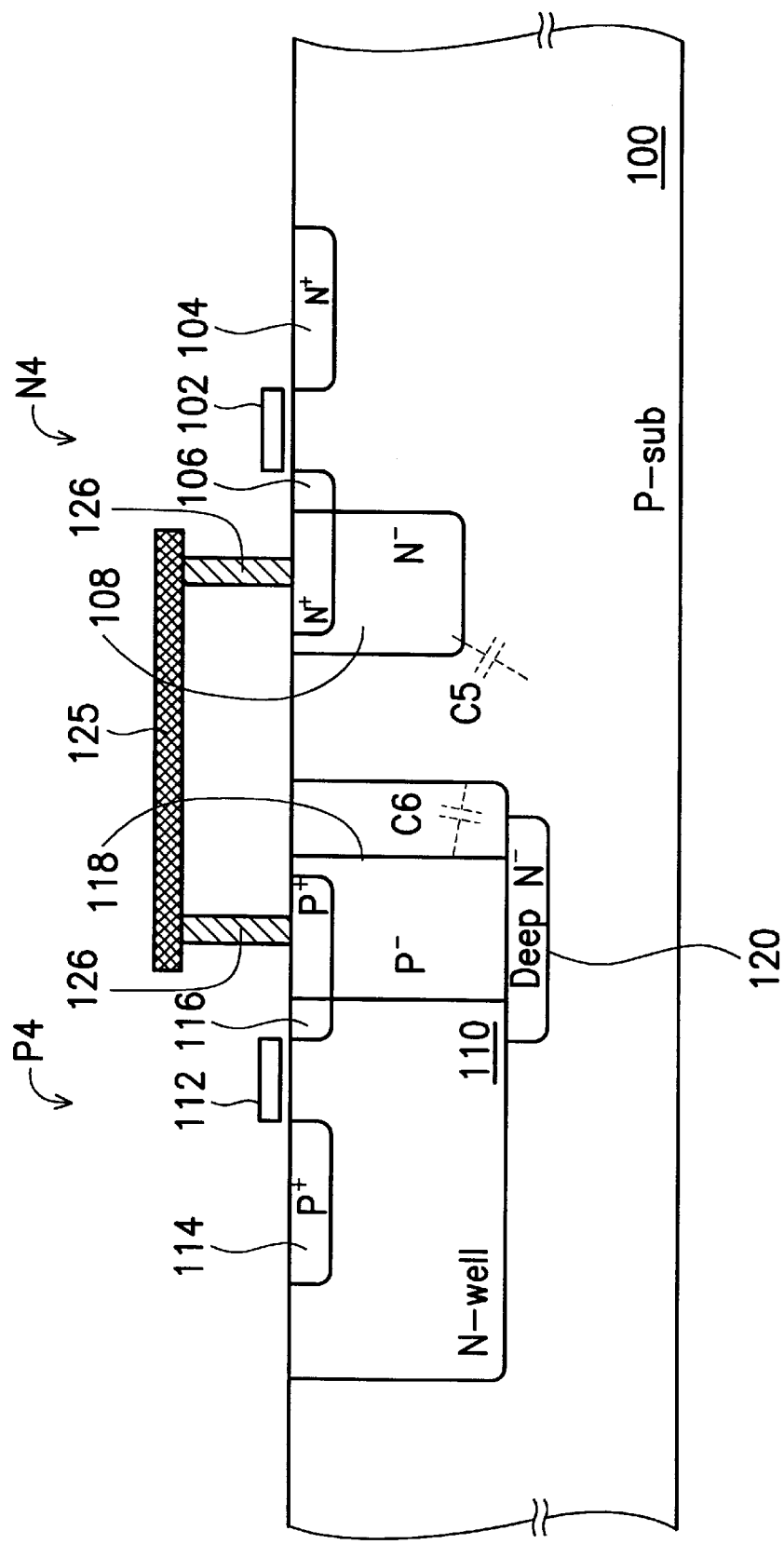
FIG. 5 is a sectional diagram showing a low junction capacitance I/O buffer which is formed on a P-type semiconductor substrate according to the present invention.

FIG. 5 is a sectional diagram showing an I/O buffer formed on a P-type semiconductor substrate according to the present invention.

In FIG. 5, the I/O buffer includes an NMOS transistor N4 and a PMOS transistor P4. The NMOS transistor N4 is formed on a P-type silicon substrate 100. The PMOS transistor P4 is formed on an N-type well 110 formed on the P-type silicon substrate 100. The NMOS transistor N4 includes a gate 102 and source and drain regions 104, 106 formed aside the gate 102. To reduce the junction capacitance of the NMOS transistor N4, which is shown as C5 in FIG. 5, an N-type lightly doped region 108 is further formed immediately adjacent to and below the drain region 106 of the NMOS transistor N4. These are similar as in FIG. 3A. Thus, the junction capacitance between the drain region 106 and the P-type silicon substrate 100 can be determined by the concentration difference between the N-type lightly doped region 108 and the P-type silicon substrate 100, which is lower than the original one.

The PMOS transistor P4 has a gate 112 and source and drain regions 114, 116 formed aside the gate 112. To reduce the junction capacitance of the PMOS transistor P4, which is shown as C6 in FIG. 5, between the drain region 116 and the N-type well 110, and P-type lightly doped region 118 is further formed in the N-type well 110 and immediately adjacent to and below the drain region 116 of the PMOS transistor P4. In addition, to prevent the P-type lightly doped region 118 (due to diffusion or any other reason) from penetrating the N-typed well 110 and directly contacting the P-type silicon substrate 100, which will result in severe damages, another N-typed deeply doped region 120 is further formed at the bottom of the P-typed lightly doped region 110 to isolate the P-type lightly doped region 118 and the P-type silicon substrate 100. These are similar as in FIG. 4A. Thus, the junction capacitance between the drain region 116 and the N-type well 110 can be determined by the concentration difference between the P-type lightly doped region 110 and the N-type well 110, which is lower than the original one. Also, the P-type lightly doped region 118 will not penetrate the N-type well 110 and contact the P-type silicon substrate 100 below the N-type well 110, which will result in serious mistakes, because of the N-type deeply doped region 120.

The pad 125 is then connected as an output terminal of the I/O buffer through contact windows 126 directly connected to drain regions 116 and 106 to lower the input capacitance of the I/O buffer, because the junction capacitance between the N-type drain region 106 of the NMOS transistor N4 and the P-type silicon substrate 100 and between the P-type drain region 116 of the PMOS transistor P4 and the N-type well 110 are both reduced.

Figure 6:
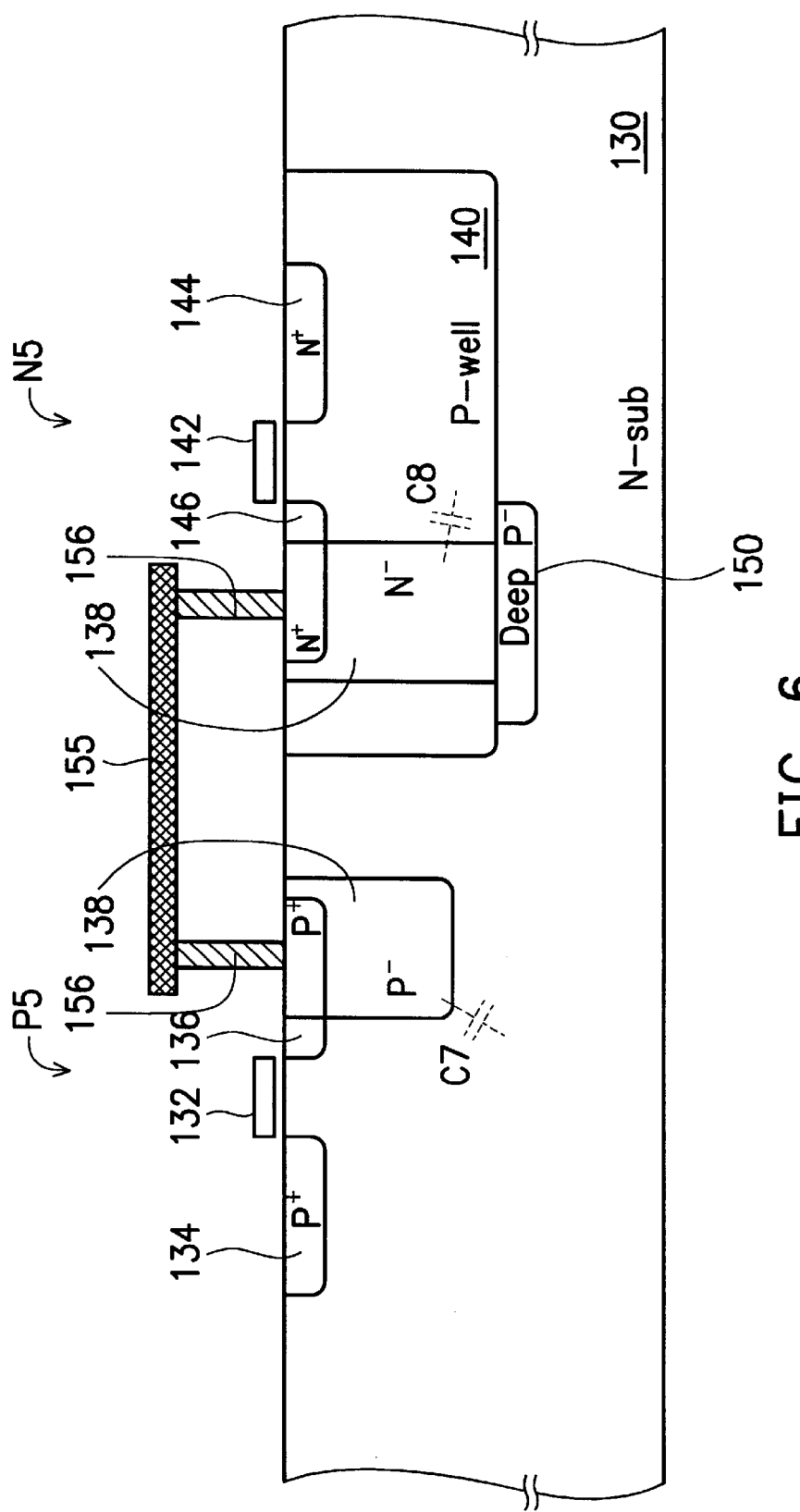
FIG. 6 is a sectional diagram showing a low junction capacitance I/O buffer which is formed on an N-type semiconductor substrate according to the present invention.

FIG. 6 is a sectional diagram showing an I/O buffer formed on an N-type semiconductor substrate according to the present invention.

In FIG. 6, the I/O buffer includes a PMOS transistor P5 and an NMOS transistor N5. The PMOS transistor P5 is formed on an N-type silicon substrate 130. The NMOS transistor N5 is formed on a P-type well 140 formed on the N-type silicon substrate 130. The PMOS transistor P5 includes a gate 132 and source and drain regions 134, 136 formed aside the gate 132. To reduce the junction capacitance, which is shown as C7 in FIG. 6, between the drain region 136 of the PMOS transistor P5 and the N-type silicon substrate 130, a P-type lightly doped region 138 is further formed immediately adjacent to and below the drain region 136 of the PMOS transistor P5. These are similar as in FIG. 3B. Thus, the junction capacitance between the drain region 136 and the N-type silicon substrate 130 can be determined by the concentration difference between the P-type lightly doped region 138 and the N-type silicon substrate 130, which is lower than the original one.

The NMOS transistor N5 has a gate 142 and source and drain regions 144, 146 formed aside the gate 142. To reduce the junction capacitance between the drain region 146 of the NMOS transistor N5 and the P-type well 140, which is shown as C8 in FIG. 6, an N-type lightly doped region 148 is further formed in the P-type well 140 and immediately adjacent to and below the drain region 146. To prevent the N-type lightly doped region 148 (due to diffusion or any other reason) from penetrating the P-type well 140 and directly contacting the N-type silicon substrate 130, which will result in sever damages, another P-type deeply doped region 150 is further formed at the bottom of the N-type lightly doped region 148 to isolate the N-type lightly region 148 and the N-type substrate 130. These are similar as in FIG. 4B. Thus, the junction capacitance between the drain region 146 and the P-type well 140 can be determined by concentration difference between the N-type lightly doped region 148 and the P-type well 140, which is lower than the original one. Also, the N-type lightly doped region 148 will not penetrate the P-type well 140 and contact the N-type silicon substrate 130 below the P-type well 140, which will result in serious mistakes, because of the P-type deeply doped region 150.

The pad 155 is then connected as an output terminal of the I/O buffer contact windows 156 directly connected to the drain regions 116 and 146 to lower the input capacitance of the I/O buffer, because the junction capacitance between the P-type drain region 136 of the PMOS transistor P5 and the N-type silicon substrate 130 and between the N-type drain region 146 of the NMOS transistor N5 and the P-type well 140 are both reduced.

Further, as mentioned in FIGS. 4A, 4B, 5 and 6, the deeply doped region, such as the P-type deeply doped region 62, 150 and the N-type deeply doped region 82, 120, can be achieved by triple well technology, which is familiar to the skilled in this technology and will be omitted. Summing up the above, the low junction capacitance semiconductor structure and I/O buffer of the present invention can reduce the junction capacitance of the semiconductor structure and the input capacitance of the I/O buffer, thus improving the hi-speed performance.

Further, the low junction capacitance semiconductor structure and I/O buffer of the present invention can occupy less chip area without losing any driving capacity and ESD endurance.

Although the present invention has been described in its preferred embodiment, it is not intended to limit the invention to the precise embodiment disclosed herein. Those who are skilled in this technology can still make various alternations and modifications without departing from the scope and spirit of this invention. Therefore, the scope of the present invention shall be defined and protected by the following claims and their equivalents.

What is claimed is:

1. A low junction capacitance semiconductor structure, comprising:

a MOS transistor formed in a well, the MOS transistor having a gate and source and drain regions formed aside the gate;

a lightly doped region having a conductivity the same as the source and drain regions, formed immediately below the drain region of the MOS transistor and having a depth equal to the well;

a contact window directly connected to the drain region; and an I/O terminal connected to the contact window.

2. The low junction capacitance semiconductor structure as claimed in claim 1, further comprising a deeply doped region having a conductivity the same as the well and being formed at the bottom of the lightly doped region.

3. The low junction capacitance semiconductor structure as claimed in claim 1, wherein e well is N-type, and the source and drain regions and the lightly doped region are P-type.

4. The low junction capacitance semiconductor structure as claimed in claim 1, wherein the well is P-type, and the source and drain regions and the lightly doped region are N-type.

5. The low junction capacitance semiconductor structure as claimed in claim 2, wherein the well and the deeply doped region are N-type, and the source and drain regions and the lightly doped region are P-type.

6. The low junction capacitance semiconductor structure as claimed in claim 2, wherein the well and the deeply doped region are P-type, and the source and drain regions and the lightly doped region are N-type.

7. A low junction capacitance I/O buffer, comprising:
   a semiconductor substrate;
   a well formed at a predetermined location on the semiconductor substrate;
   a first transistor formed on the semiconductor substrate, having a first gate and first source and drain regions formed aside the first gate;
   a second transistor formed on the well, having a second gate and second source and drain regions formed aside the second gate;
   a first lightly doped region formed immediately below the first drain region, having a conductivity the same as the first source and drain regions of the first transistor;
   a second lightly doped region formed immediately below the second drain region, having a conductivity the same as the second source and drain regions and having a depth equal to the well;
   a first and second contact window directly connected to the first and second drain region, respectively; and
   an I/O terminal connected to the first and second contact window.

8. The low junction capacitance I/O buffer as claimed in claim 7, further comprising a deeply doped region formed at the bottom of the second lightly doped region in the well.

* * * * *